United States Patent
Xiao et al.

(10) Patent No.: US 9,424,872 B1
(45) Date of Patent: Aug. 23, 2016

(54) IMPRINT TEMPLATE FOR PATTERNED RECORDING MEDIA

(71) Applicant: Seagate Technology LLC, Cupertino, CA (US)

(72) Inventors: Shuaigang Xiao, Fremont, CA (US); XiaoMin Yang, Livermore, CA (US); Kim Y. Lee, Fremont, CA (US); Yautzong Hsu, Fremont, CA (US); Hongying Wang, Fremont, CA (US)

(73) Assignee: Seagate Technologies LLC, Cupertino, CA (US)

( * ) Notice: Subject to any disclaimer, the term of this patent is extended or adjusted under 35 U.S.C. 154(b) by 0 days.

(21) Appl. No.: 14/815,855

(22) Filed: Jul. 31, 2015

(51) Int. Cl.
*G11B 5/855* (2006.01)
*G11B 5/74* (2006.01)
*G11B 5/84* (2006.01)
*G03F 7/00* (2006.01)

(52) U.S. Cl.
CPC .............. *G11B 5/746* (2013.01); *G03F 7/0002* (2013.01); *G11B 5/84* (2013.01)

(58) Field of Classification Search
None
See application file for complete search history.

(56) References Cited

U.S. PATENT DOCUMENTS

| | | | |
|---|---|---|---|
| 7,399,422 B2 | 7/2008 | Sewell | |
| 7,636,214 B2 | 12/2009 | Imada et al. | |
| 7,894,155 B2 | 2/2011 | Sakurai et al. | |
| 7,978,434 B2 * | 7/2011 | Kimura | B82Y 10/00 360/131 |
| 8,525,219 B2 * | 9/2013 | Katayama | C08L 83/04 257/100 |
| 8,526,132 B2 * | 9/2013 | Albrecht | G11B 5/596 360/48 |
| 8,531,792 B1 * | 9/2013 | Burd | G11B 5/59666 360/51 |
| 8,941,938 B1 * | 1/2015 | Xiao | G11B 5/746 360/48 |
| 2005/0094298 A1 | 5/2005 | Sakurai et al. | |
| 2013/0193103 A1 | 8/2013 | Van De Veerdonk | |

OTHER PUBLICATIONS

Thomas R. Albrecht, et al., "Bit Patterned Media at 1 Tdot/in2 and Beyond", IEEE Transactions on Magnetics, vol. 9, No. 2, Feb. 2013, HGST, a Western Digital Company, San Jose Research Center, San Jose, California 95135 USA, Jan. 22, 2013, Digital Object Identifier 10.1109/TMAG.2012.2227303, 6 pages.

(Continued)

*Primary Examiner* — K. Wong

(57) ABSTRACT

Provided herein is an apparatus including a rectangular array of rectangular protrusions in a first region corresponding to a data region; and a hexagonal array of circular protrusions in a second region corresponding to a servo region, wherein a first global protrusion density for the first region is greater than a second global protrusion density for the second region. Also provided herein is a method including forming a first template; forming a second template; and cross-imprinting the first template and the second template to form a third template corresponding to the foregoing apparatus.

20 Claims, 12 Drawing Sheets

(56) References Cited

OTHER PUBLICATIONS

Rhys Alun Griffiths, et al., "Directed Self-Assembly of Block Copolymers for use in Bit Patterned Media Fabrication", Journal of Physics D: Applied Physics, J. Phys. D: Appl. Phys. 46 (2013) 503001 (29pp), Published Nov. 25, 2013, stacks.iop.org/JPhysD/46/503001, 30 pages.

J. Lille, et al, "Integration of Servo and High Bit Aspect Ratio Data Patterns on Nanoimprint Templates for Patterned Media", IEEE Transactions on Magnetics, vol. 48, No. 11, Nov. 2012, Hitachi San Jose Research Center, San Jose, CA 95135 USA, Oct. 19, 2012, Digital Object Identifier 10.1109/TMAG.2012.2192916, 4 pages.

Lei Wan, et al, "Fabrication of Templates with Rectangular Bits on Circular Tracks by Combining Block Copolymer Directed Self-Assembly and Nanoimprint Lithography", Journal of Micro/Nanolith. MEMS MOEMS vol. 11(3), 031405 (Jul.-Sep. 2012), 6 pages.

* cited by examiner

IMPRINT TEMPLATE FOR PATTERNED RECORDING MEDIA

BACKGROUND

Templates for bit-patterned media ("BPM") fabricated by means of directed self-assembly ("DSA") using block copolymers ("BCPs") are known.

SUMMARY

Provided herein is an apparatus including a rectangular array of rectangular protrusions in a first region corresponding to a data region; and a hexagonal array of circular protrusions in a second region corresponding to a servo region, wherein a first global protrusion density for the first region is greater than a second global protrusion density for the second region.

Also provided herein is a method including forming a first template; forming a second template; and cross-imprinting the first template and the second template to form a third template corresponding to the foregoing apparatus.

These and other features of the concepts provided herein may be better understood with reference to the following drawings, description, and appended claims.

DRAWINGS

Figure 1A:
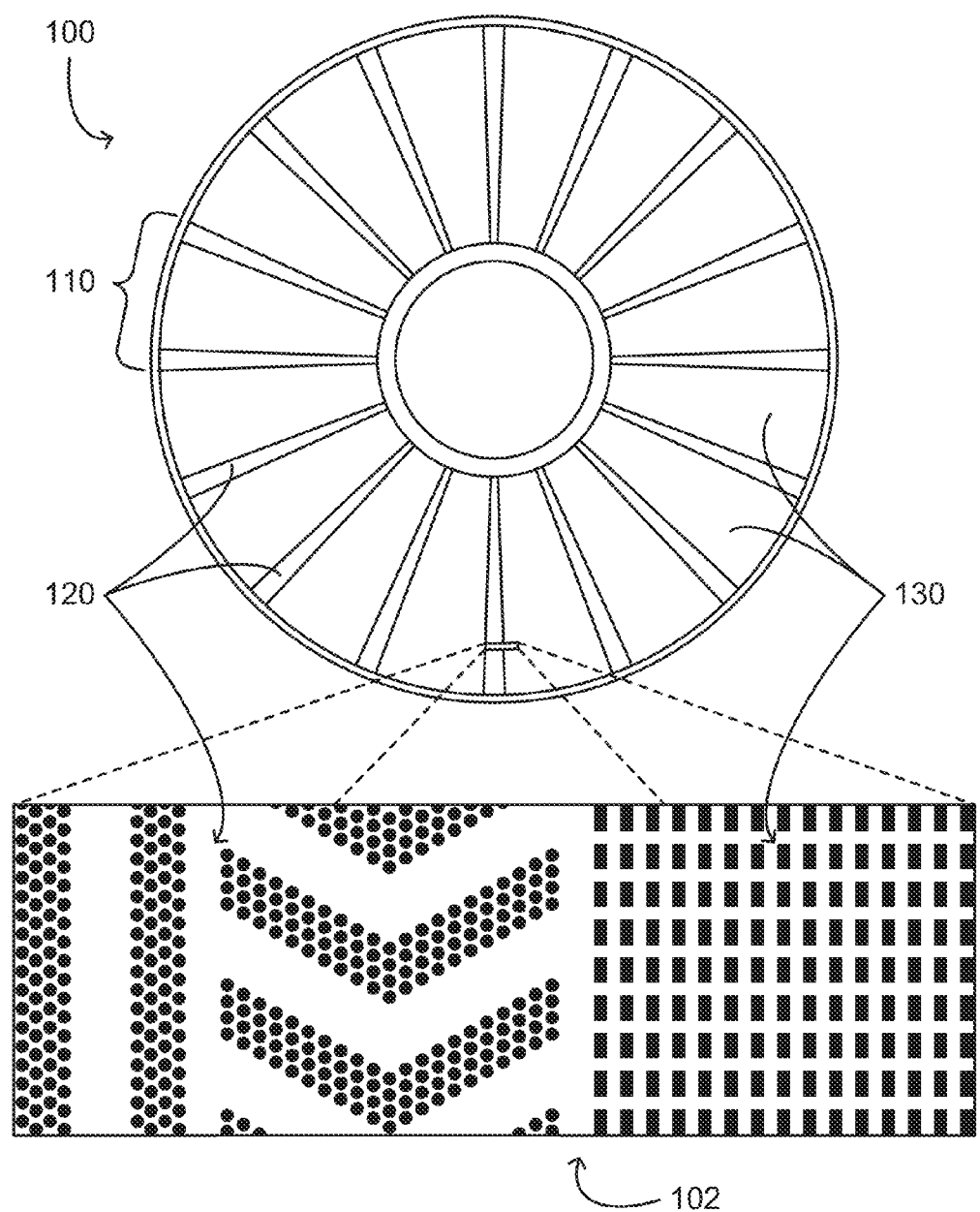

FIG. 1A provides a schematic illustrating a template for patterned recording media in accordance with some embodiments.

Figure 1B:
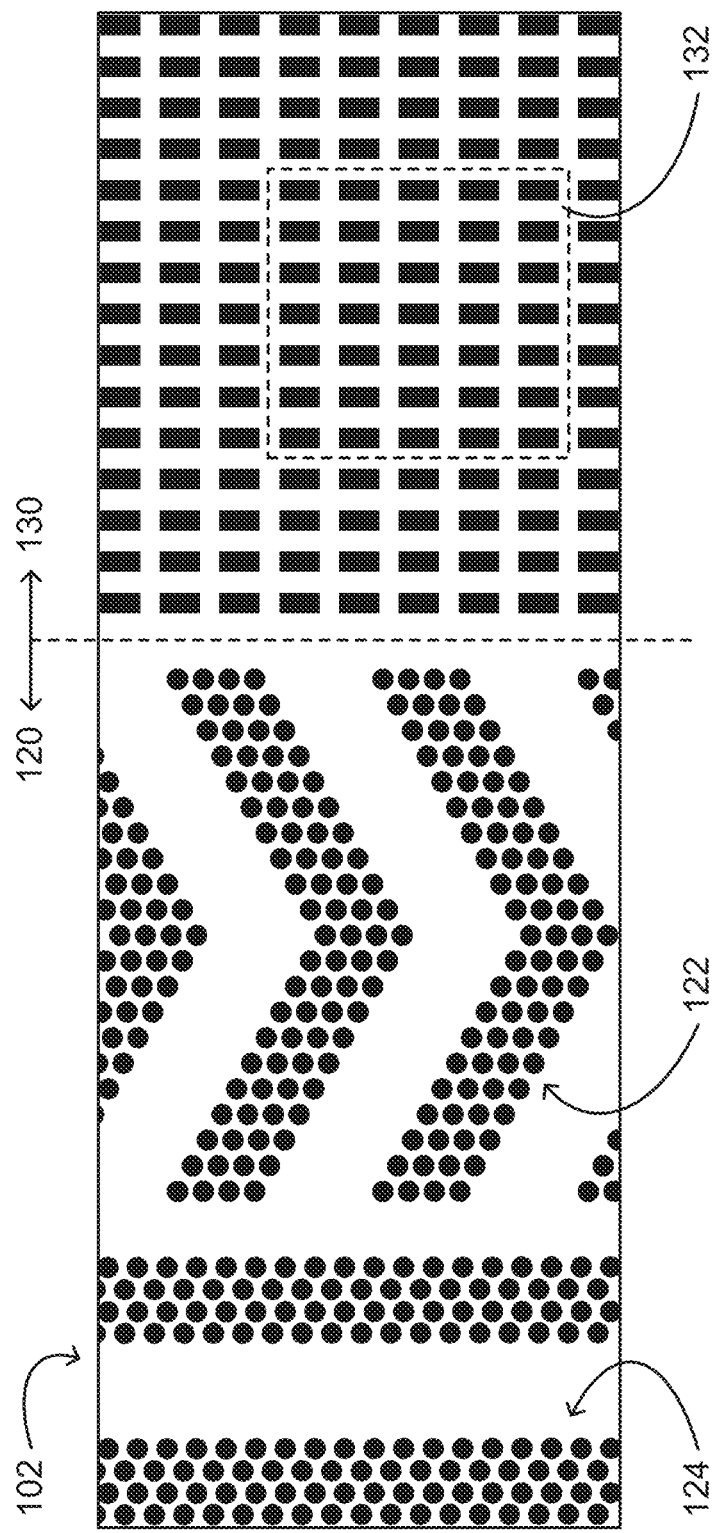

FIG. 1B provides a schematic illustrating a pattern of the template of FIG. 1A in accordance with some embodiments.

Figure 2A:
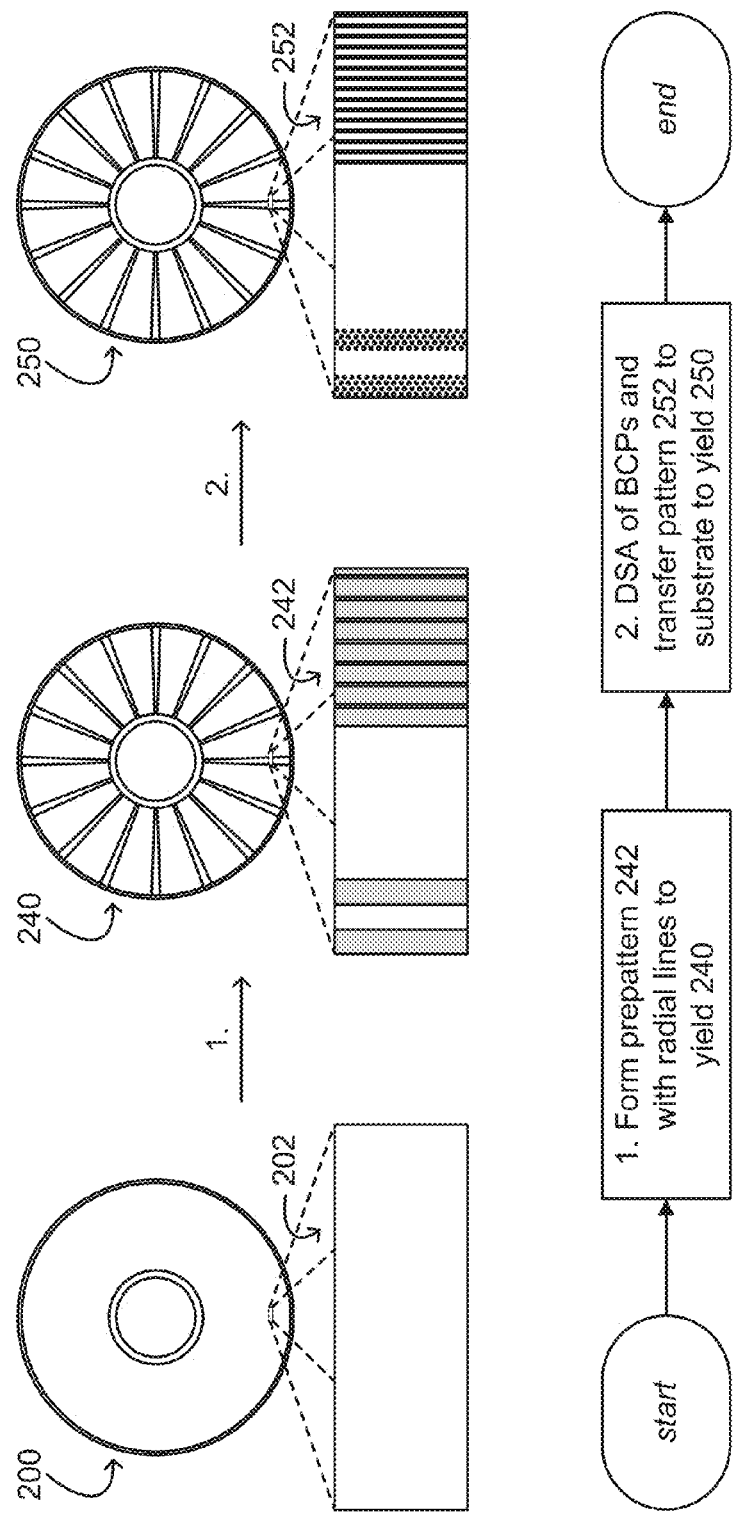

FIG. 2A provides a schematic illustrating template fabrication for a first template in accordance with some embodiments.

Figure 2B:
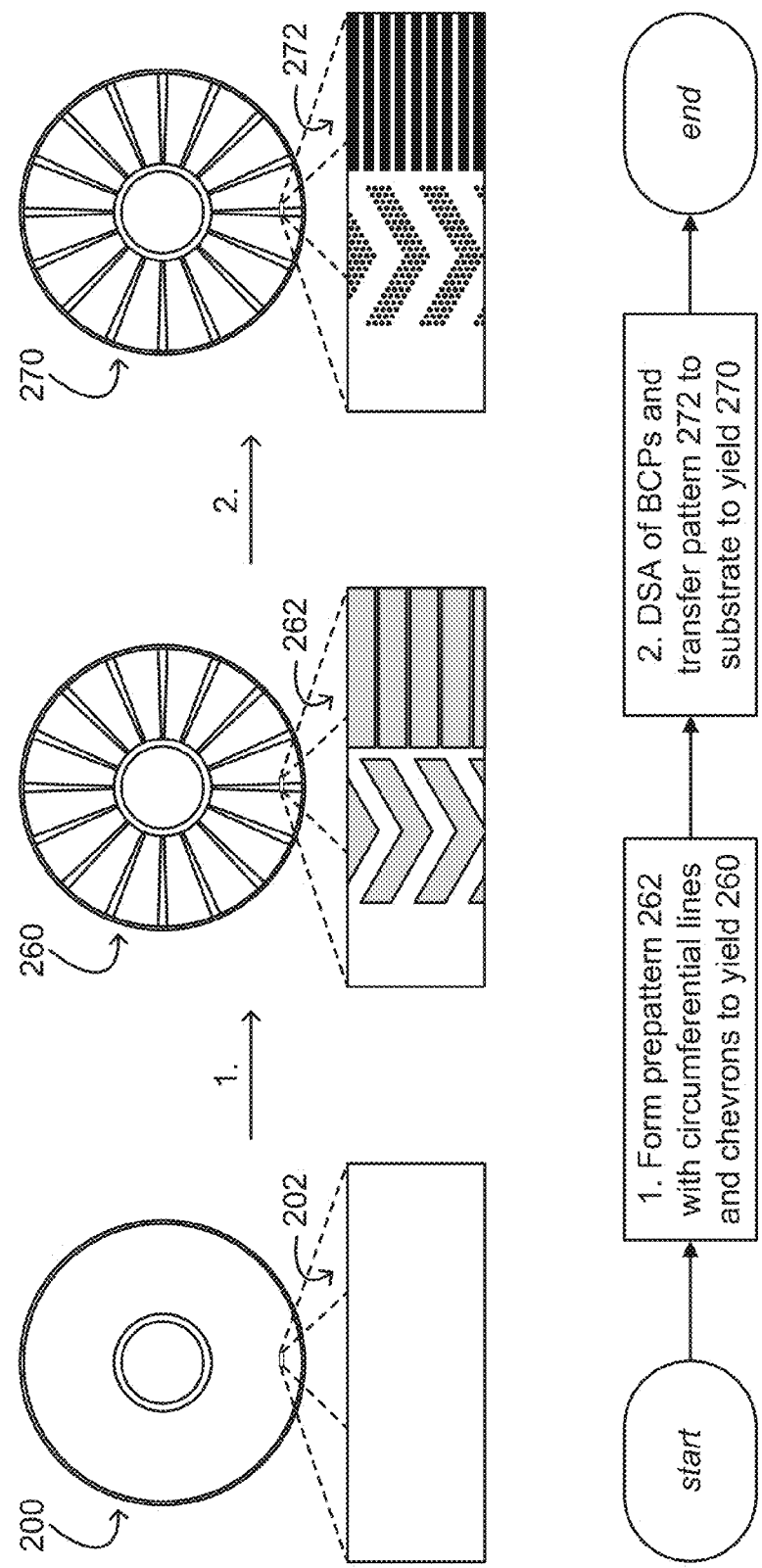

FIG. 2B provides a schematic illustrating template fabrication for a second template in accordance with some embodiments.

Figure 2C:
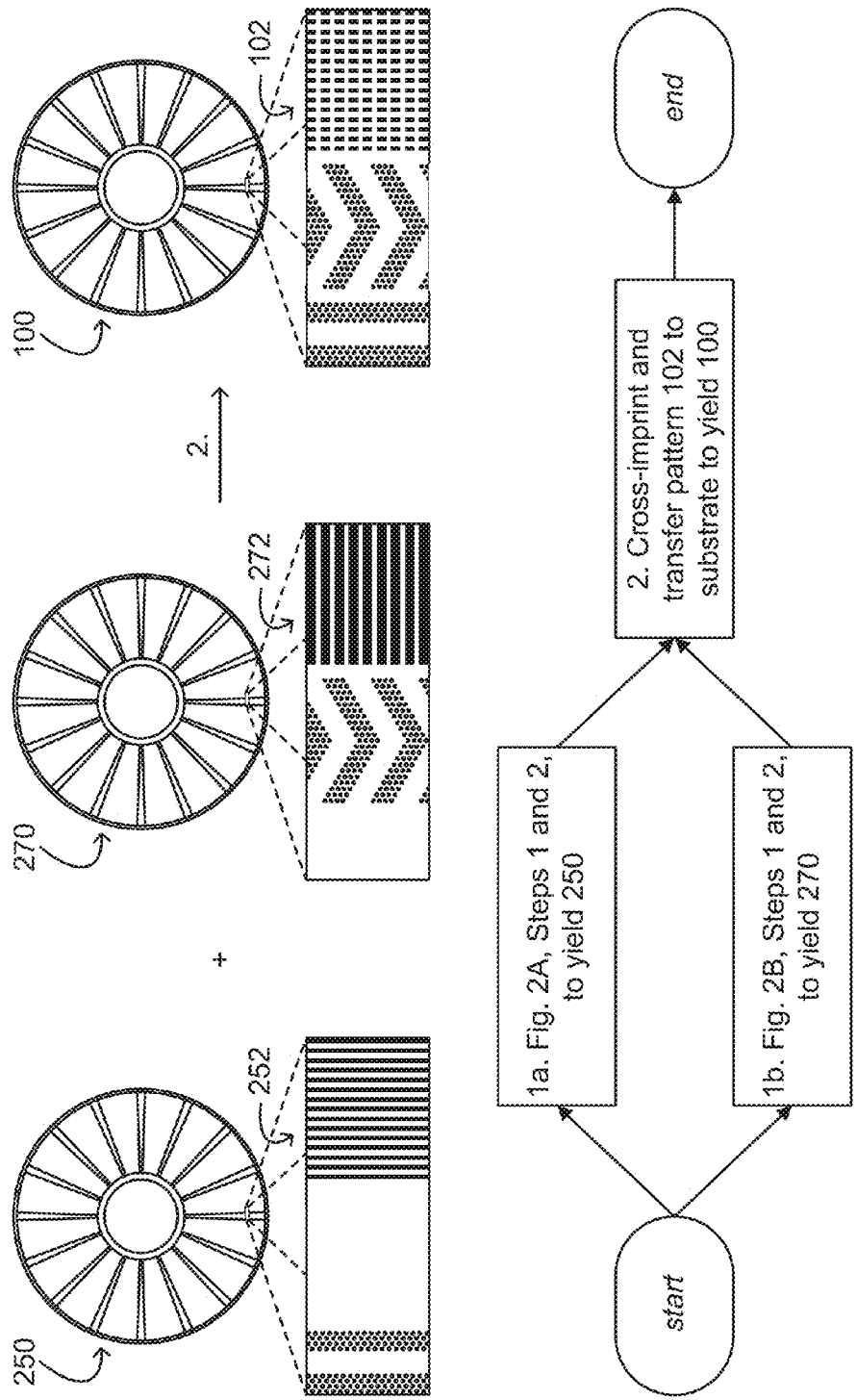

FIG. 2C provides a schematic illustrating template fabrication for a template by cross-imprinting the first template of FIG. 2A and the second template of FIG. 2B in accordance with some embodiments.

Figure 3A:
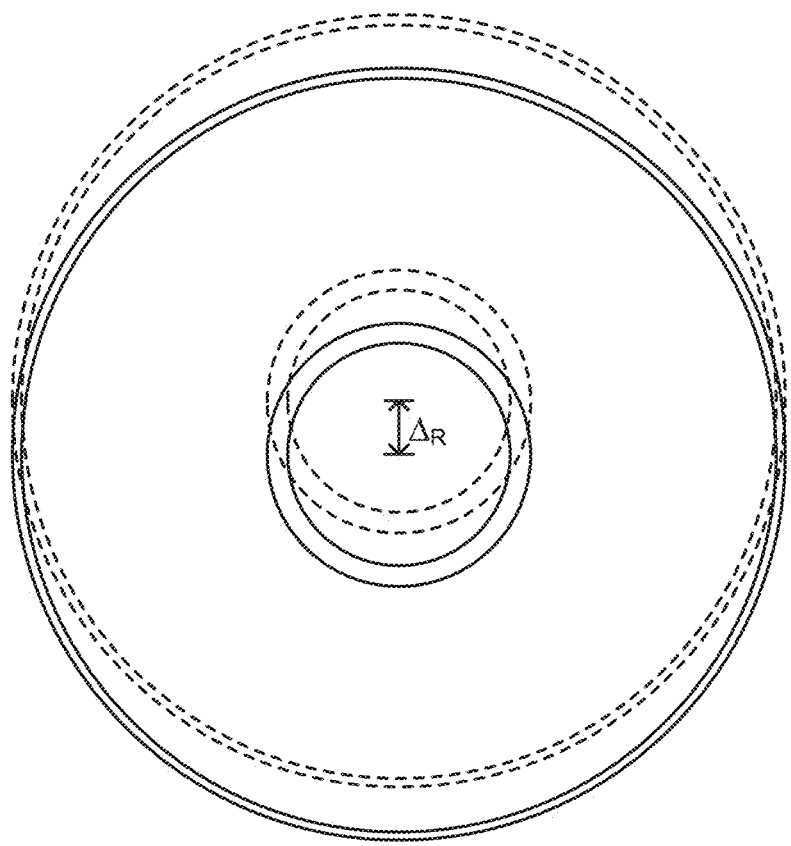

FIG. 3A provides a schematic illustrating radial displacement in template fabrication in accordance with some embodiments.

Figure 3B:
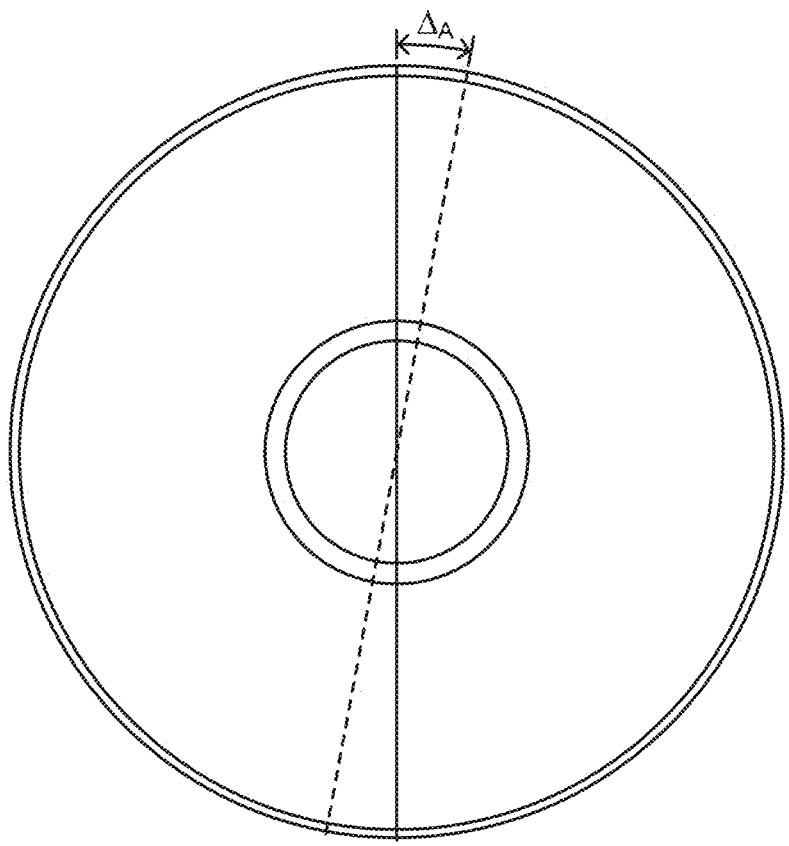

FIG. 3B provides a schematic illustrating angular displacement in template fabrication in accordance with some embodiments.

Figure 4A:
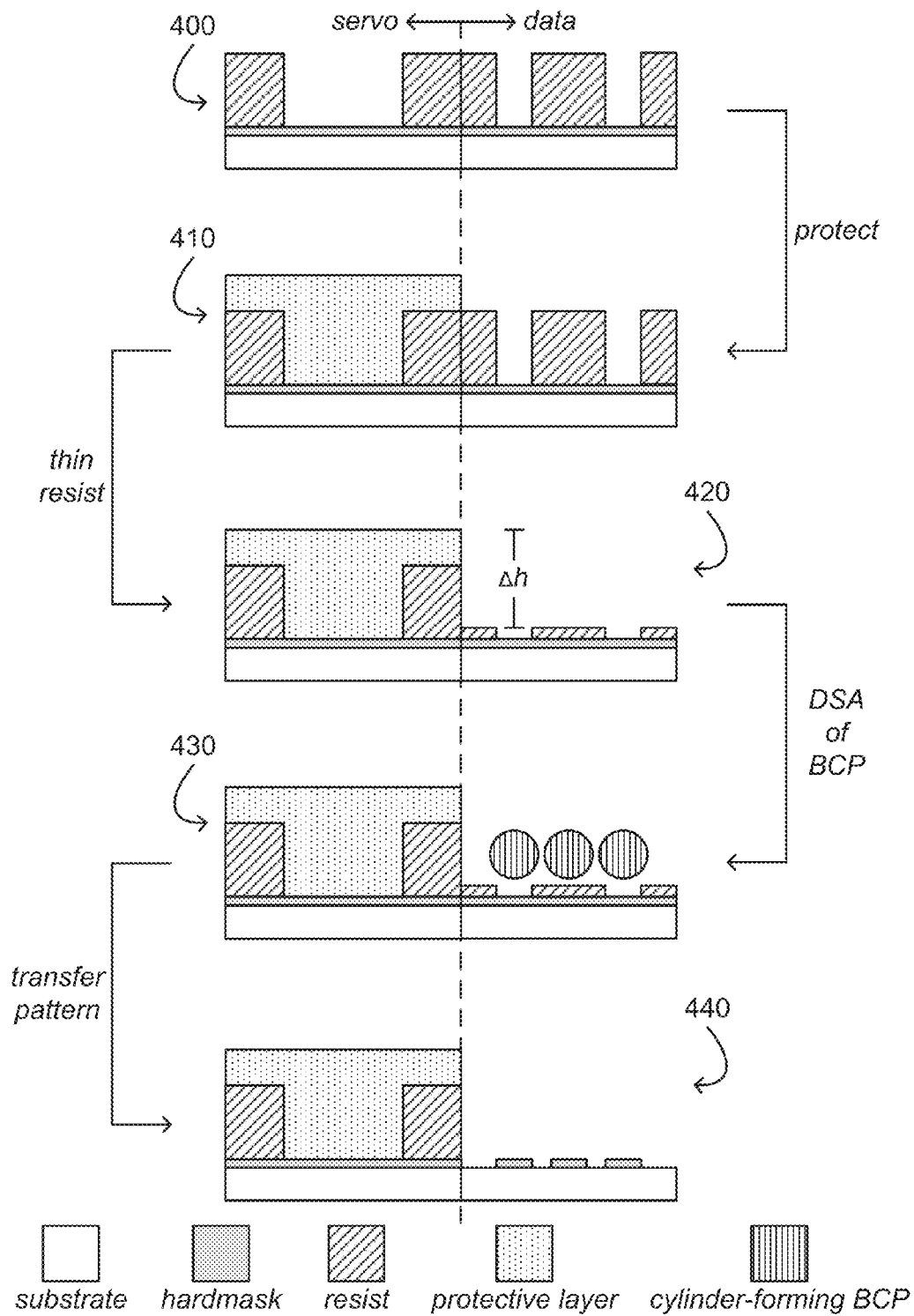

FIG. 4A provides a schematic illustrating template fabrication for the first template of FIG. 2A or the second template of FIG. 2B in accordance with some embodiments.

Figure 4B:
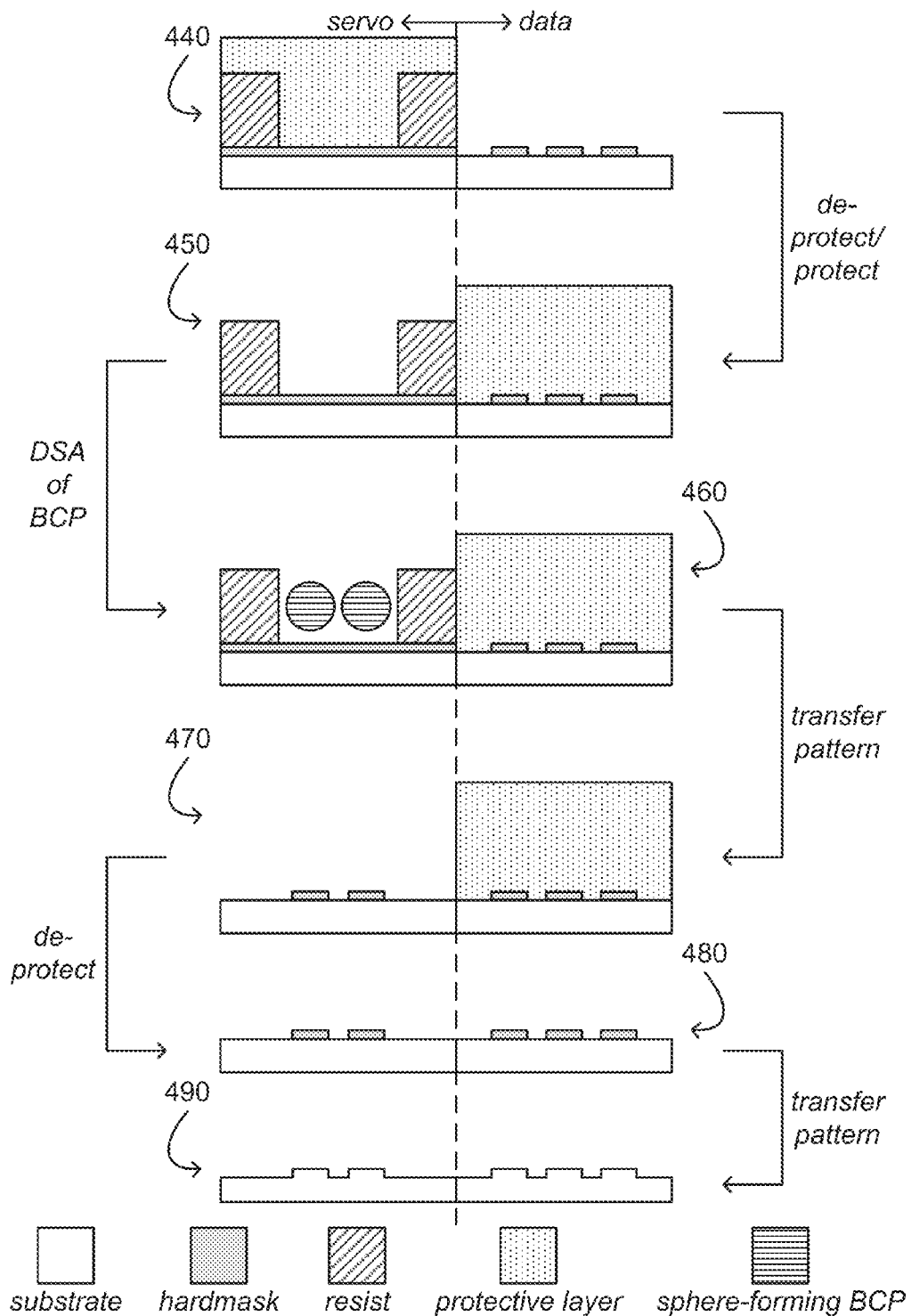

FIG. 4B provides a schematic illustrating template fabrication for the first template of FIG. 2A or the second template of FIG. 2B in accordance with some embodiments.

Figure 5A:
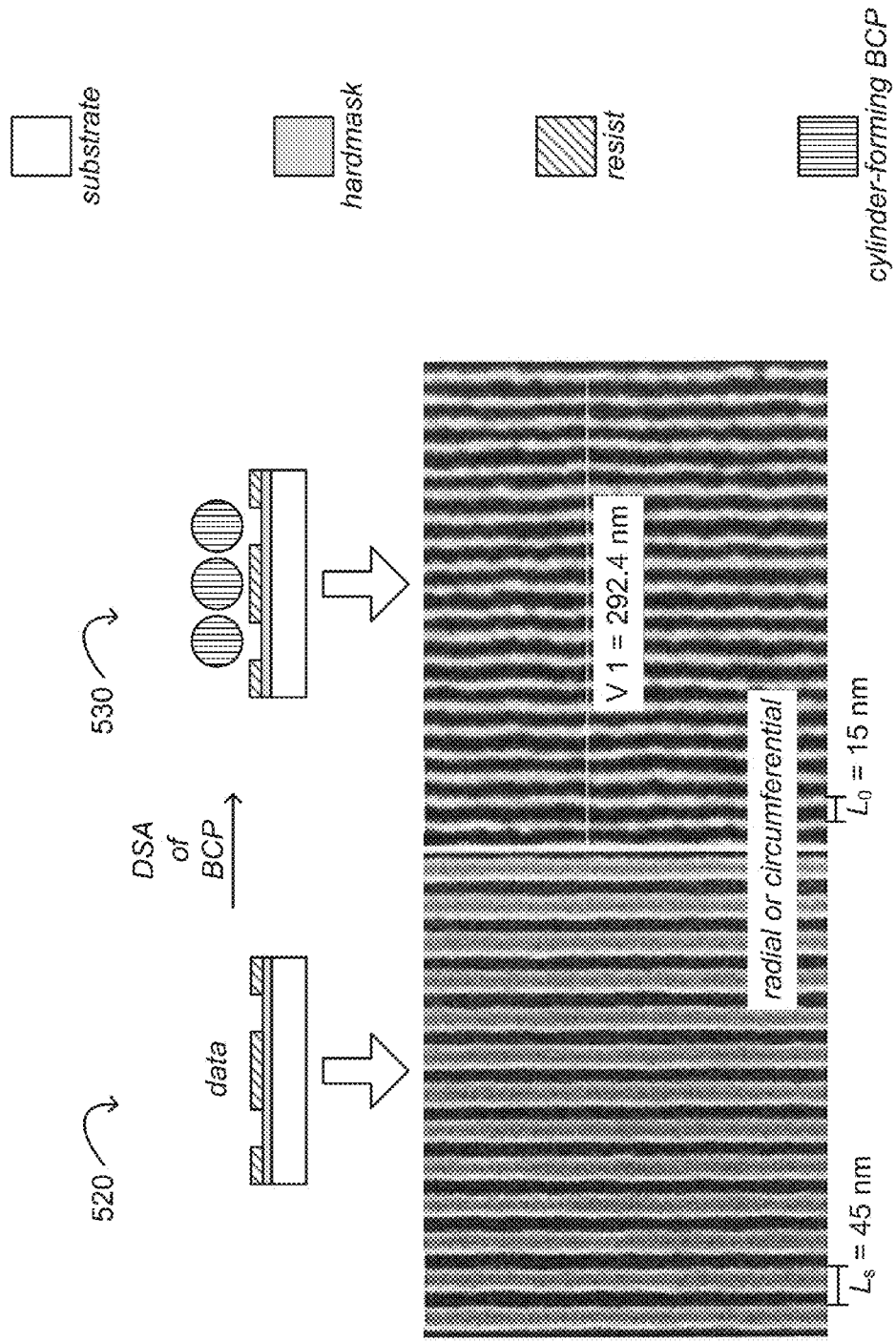

FIG. 5A provides a schematic illustrating DSA of cylinder-forming BCPs and an image therefor in accordance with some embodiments.

Figure 5B:
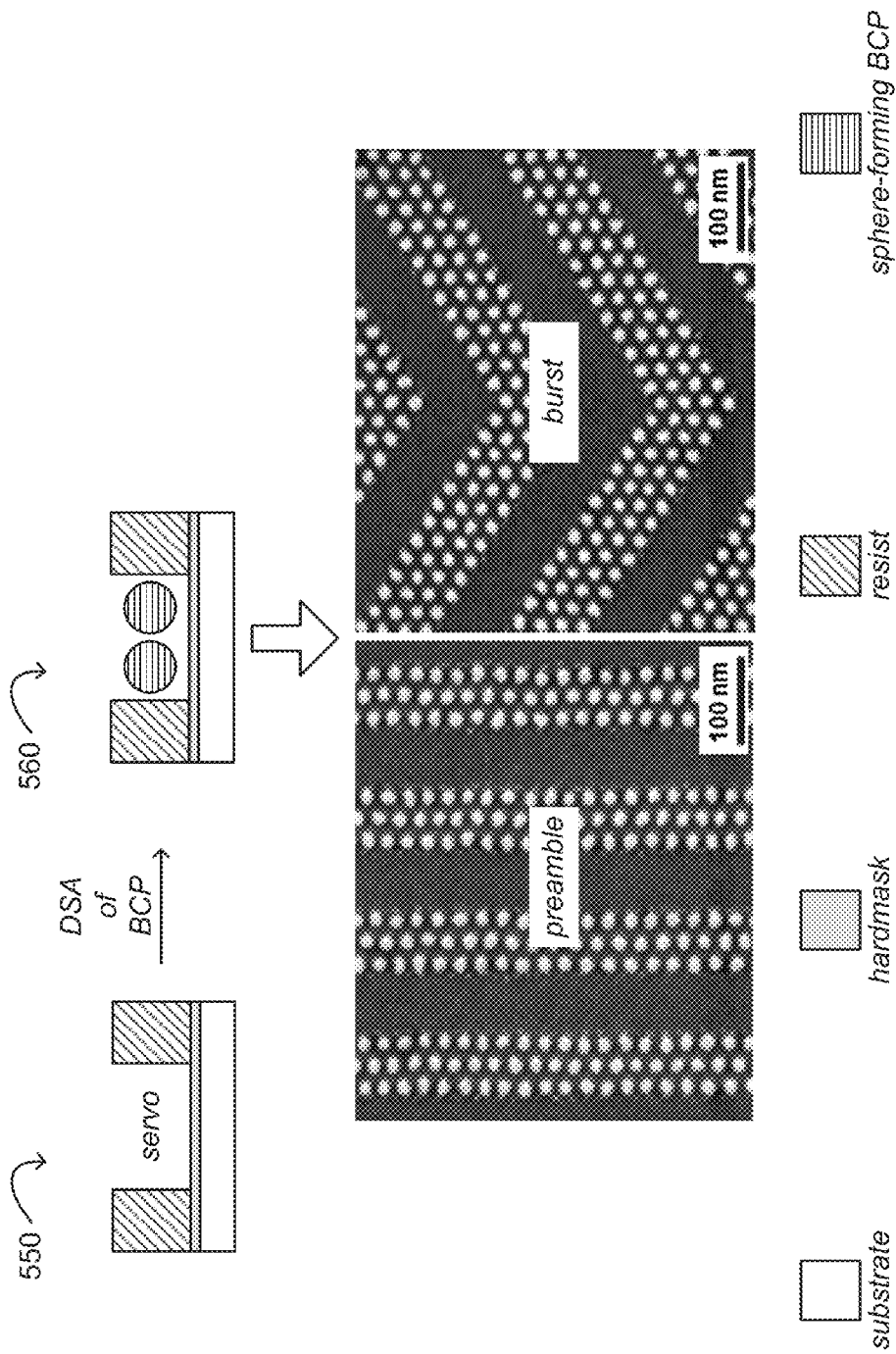

FIG. 5B provides a schematic illustrating DSA of cylinder-forming BCPs and an image therefor in accordance with some embodiments.

Figure 6:
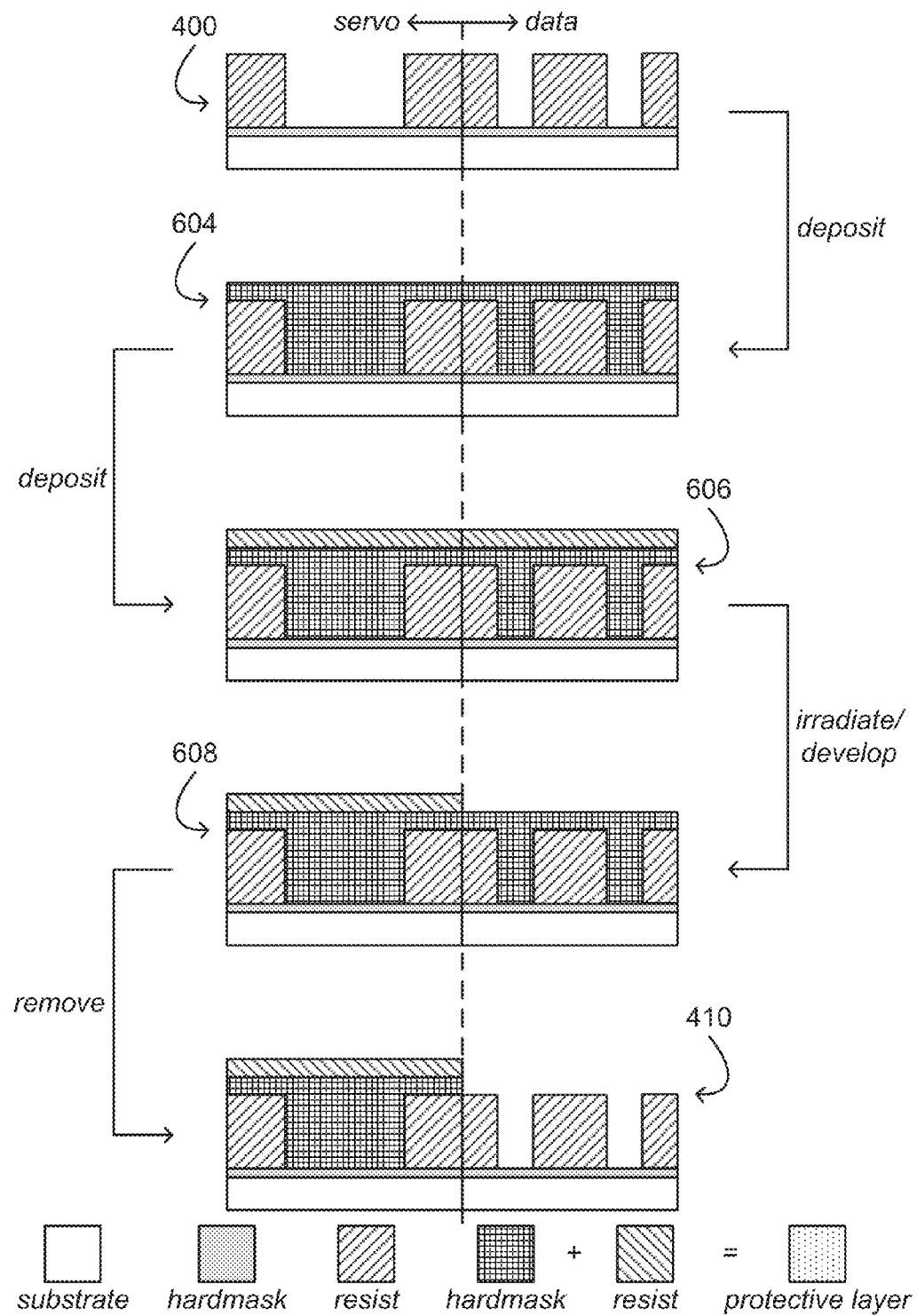

FIG. 6 provides a schematic illustrating servo region protection in template fabrication in accordance with some embodiments.

DESCRIPTION

Before some particular embodiments are provided in greater detail, it should be understood by those of ordinary skill in the art that the particular embodiments do not limit the scope of the concepts provided herein, as features of such particular embodiments may vary. It should likewise be understood that a particular embodiment has features that may be readily separated from the particular embodiment and optionally combined with or substituted for features of any of a number of other embodiments provided herein.

It should also be understood by those of ordinary skill in the art that the terminology used herein is for the purpose of describing some particular embodiments, and the terminology does not limit the scope of the concepts provided herein. Unless indicated otherwise, ordinal numbers (e.g., first, second, third, etc.) are used to distinguish or identify different features or steps in a group of features or steps, and do not supply a serial or numerical limitation. For example, "first," "second," and "third" features or steps need not necessarily appear in that order, and the particular embodiments need not necessarily be limited to the three features or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It should be understood that while templates for patterned recording media are provided herein, features of a template may directly correspond to features of a patterned recording medium. It should also be understood that while patterned recording media are provided herein, features of a patterned recording medium may directly correspond to features of a template. For example, features provided in reference to protrusions in a template may directly correspond to magnetic features in a patterned recording medium.

Unless defined otherwise, all technical and scientific terms used herein have the same meaning as commonly understood by those of ordinary skill in the art.

Templates for hexagonal BPM fabricated by means of DSA using sphere- or cylinder-forming (standing up) BCPs have a skew limit tolerance of up to about 8°. Templates for rectangular BPM fabricated by cross-imprinting sub-templates made by means of cylinder-forming (lying down) or lamella-forming block copolymer DSA provide one solution to the foregoing skew limit. However, servo integration in such templates for rectangular BPM is difficult because it is difficult to produce complex, non-regular BPM servo patterns by lamella-forming BCP DSA in the sub-templates and subsequent cross-imprinting of the sub-templates. Provided herein are apparatuses and methods including complex, non-regular servo pattern integration.

FIG. 1A provides a schematic illustrating a template 100 for patterned recording media in accordance with some embodiments. The template 100 is a non-limiting example of a template including servo regions and data regions patterned therein.

The template 100 may include any template (e.g., microimprint template, nanoimprint template, etc.) for any recording medium or recording media to which lithographic (e.g., microlithographic, nanolithographic, etc.) patterning may be applied or extended. The template 100 may include, but is not limited to, a template for longitudinal magnetic recording ("LMR") media, a template for perpendicular magnetic recording ("PMR") media, a template for heat-assisted magnetic recording ("HAMR") media, a template for discrete track recording ("DTR") media, or a template for bit-patterned media ("BPM"). In some embodiments, for example, the template 100 may include a template for BPM such as hexagonal BPM, rectangular BPM, or a combination of hexagonal and rectangular BPM. It should be understood that the template 100 of FIG. 1A is a schematic provided to aid understanding. While the template may include additional features such as zones for zoned bit recording in corresponding patterned recording media, the template 100 of FIG. 1A is illustrated without such additional features.

The template 100 of FIG. 1A may include a servo scheme 110 (see portion thereof) patterned therein corresponding to a servo scheme of patterned recording media. The servo scheme 110 is a non-limiting example of a servo scheme. The servo scheme 110 may include, but is not limited to, a wedge servo scheme, an embedded servo scheme, or a dedicated servo scheme. In some embodiments, for example, the servo scheme 110 may be an embedded servo scheme such as the embedded servo scheme 110 of FIG. 1A. Because the template 100 of FIG. 1A is a schematic without additional features such as zones for zoned bit recording in corresponding patterned recording media, it should be understood that the servo scheme 110 is not limited to the layout of FIG. 1A. The servo scheme 110 of FIG. 1A, or any other servo scheme for patterned recording media, including, but not limited to the foregoing, may have a layout in accordance with zone bit recording.

The template 100 of FIG. 1A may include patterned servo regions or servo sectors 120 alternately arranged with patterned data regions or data sectors 130, which servo regions 120 and data regions 130 correspond to those found in patterned recording media fabricated using the template 100, and which servo regions 120 and data regions 130 serve to demarcate certain regions of the template 100. The servo regions 120 may include any of a number of servo patterns for servo sector fields necessary to support servo functions of recording devices in which patterned recording media corresponding to the template 100 are used. The servo sector fields may include, but are not limited to, one or more servo sector fields selected from a sync field including a phase-locked loop ("PLL") field or an interspersed PLL ("iPLL") field, an adaptive gain control ("AGO") field, and/or a preamble field; a servo address mark ("SAM") field or servo index mark ("SIM") field; a Gray-coded track identification field; and a position error signal ("PES") burst pattern field. In some embodiments, for example, the servo regions 120 may include the PES burst pattern field of FIG. 1A, which PES burst pattern field may be the PES burst pattern field 122 of FIG. 1B. In some embodiments, for example, the servo regions 120 may include the preamble of FIG. 1A, which preamble may be the preamble 124 of FIG. 1B.

FIG. 1B provides a schematic illustrating a pattern 102 (or a portion thereof) of the template 100 of FIG. 1A in accordance with some embodiments. The pattern 102 is a non-limiting example of a pattern for a template including one or more servo regions 120 patterned therein.

While the servo regions 120 may include any recording device-necessitated servo sector fields, a PES burst pattern field 122 and a preamble 124 are illustrated in the pattern 102 of FIG. 1B as an example. The PES burst pattern field 122 may include any of a number of patterned features, including, but not limited to, patterned chevron-shaped features or chevrons, two of which are illustrated in FIG. 1B. The patterned chevron-shaped features may include any of a number of different protrusions, including, but not limited to, the hexagonal array of circular protrusions illustrated in FIG. 1B. The preamble 124 may include any of a number of patterned features, including, but not limited to, patterned radial line-shaped features or radial lines, two of which are illustrated in FIG. 1B. The patterned radial line-shaped features may include any of a number of different protrusions, including, but not limited to, the hexagonal array of circular protrusions illustrated in FIG. 1B.

The protrusions of one or more servo regions 120 may be dimensioned such that corresponding magnetic features in patterned recording media are thermally stable. Accordingly, single magnetic domains corresponding to magnetic features in patterned recording media may be thermally stable to reversal and/or to splitting into smaller magnetic domains under normal operating conditions for the patterned recording media. In some embodiments, for example, the protrusions of one or more servo regions 120 may be about 10 nm up to about 15 nm in a minor dimension or a down-track direction. In some embodiments, for example, the protrusions of one or more servo regions 120 may be no more than about 100 nm, 90 nm, 80 nm, 70 nm, 60 nm, 50 nm, 40 nm, 30 nm, 20 nm, or 10 nm in a major dimension or a cross-track direction. Combinations of the foregoing may be used to describe the dimensions of the protrusions. In some embodiments, for example, the protrusions of one or more servo regions 120 may be about 10 nm in a minor dimension and no more than about 100 nm in a major dimension, including about 10 nm in a minor dimension and no more than about 80 nm in a major dimension, including about 10 nm in a minor dimension and no more than about 60 nm in a major dimension, including about 10 nm in a minor dimension and no more than about 40 nm in a major dimension, and including about 10 nm in a minor dimension and no more than about 20 nm in a major dimension.

Again, FIG. 1B provides a schematic illustrating a pattern 102 (or a portion thereof) of the template 100 of FIG. 1A in accordance with some embodiments. The pattern 102 is a non-limiting example of a pattern for a template further including one or more data regions 130 patterned therein.

While the data regions 130 may include any recording device-necessitated data fields, one of a number of data fields 132 (see outlined portion) is illustrated in the pattern 102 of FIG. 1B as an example. The data fields 132 may be coextensive with their respective data regions 130, or the data fields 132 may occupy a portion of their respective data regions 130. The data fields 132 may include any arrangement of protrusions, including, but not limited to, a rectangular array (or pseudo-rectangular array) of protrusions consistent with magnetic features of corresponding patterned recording media such as rectangular BPM as illustrated in FIG. 1B. To accommodate arc-tracing, slider-mounted read-write heads in recording devices including corresponding patterned recording media, the rectangular array of protrusions may have a skew angle of more than about 8° such as about 15°. The rectangular array of protrusions may include any of a number of different protrusions, including, but not limited to, the rectangular protrusions illustrated in FIG. 1B.

The protrusions of one or more data regions 130 may be dimensioned such that corresponding magnetic features in patterned recording media are thermally stable. Accordingly, single magnetic domains corresponding to magnetic features in patterned recording media may be thermally stable to reversal and/or to splitting into smaller magnetic domains under normal operating conditions for the patterned recording media. The protrusions of one or more data regions 130 may have a bit aspect ratio ("BAR") between about 1 and 4, wherein the BAR is a ratio of dimensions corresponding to a ratio of a major dimension or a cross-track direction to a minor dimension or a down-track direction. In some embodiments, for example, the protrusions of one or more data regions 130 may be dimensioned such that corresponding magnetic features in patterned recording media may have a BAR between about 1 and 4, including a BAR between about 1 and 3, and including a BAR between about 1 and 2. Such a BAR is favorable to both fabrication of read-write heads for recording devices and fabrication of templates in accordance with one or more methods provided herein. In some embodiments, for example, the protrusions of one or more data regions 130 may be about 10 nm up to about 15 nm in a minor dimension or a down-track direction. In some embodiments, for example, the protrusions of one or more data regions 130 may be no more than about 40 nm, 30 nm, 20 nm, or 10 nm in a major dimension or a cross-track direction. Combinations of the foregoing may be used to describe the dimensions of the protrusions. In some embodiments, for example, the protrusions of one or more data regions 130 may be about 10 nm in a minor dimension and no more than about 40 nm in a major dimension, including about 10 nm in a minor dimension and no more than about 30 nm in a major dimension, including about 10 nm in a minor dimension and no more than about 20 nm in a major dimension, and including about 10 nm in a minor dimension and no more than about 10 nm in a major dimension.

The data regions 130 may be regular with respect to the pattern of protrusions. For example, the rectangular array of protrusions in the data regions 130 of FIG. 1B may be formed into the data fields 132, which have regularly repeating rectangular protrusions in each of the cross-track and down-track directions. Comparatively, the servo regions 120 may be irregular with respect to the pattern of protrusions. For example, the hexagonal array of protrusions in the servo regions 120 of FIG. 1B may be formed into the chevron-shaped features 122 and the radial line-shaped features 124, which, in combination, have irregularly repeating circular protrusions in either one direction or both directions of the cross-track and down-track directions.

The data regions 130 may be dense with respect to the number of protrusions per unit area over a specific surface area and/or an entire surface area of the template 100. Comparatively, the servo regions 120 may be sparse with respect to the number of protrusions per unit area over the specific surface area and/or the entire surface area of the template 100. Considering the number of protrusions per unit area over a specific surface area of the template 100 to be a local protrusion density, and considering the number of protrusions per unit area over the entire surface area of the template 100 to be a global protrusion density, the data regions 130 may have a greater local and/or global protrusion density than the servo regions 120.

FIG. 2A provides a schematic illustrating template fabrication for a first sub-template or a first template 250 in accordance with some embodiments. The template fabrication for the first template 250 is a non-limiting example of template fabrication for a template including servo regions and data regions patterned therein.

In a first step, a first pattern 242 of relatively low resolution may be created on a substrate 200 in a to-be-patterned area 202 to provide a workpiece 240 including the first pattern 242. The first pattern 242 may include, but is not limited to, a graphoepitaxial pre-pattern of radial line-shaped features for DSA of BCPs. In some embodiments, for example, the first pattern 242 may be a graphoepitaxial pre-pattern formed by electron-beam lithography, interference lithography, photolithography, imprint lithography, or a combination thereof. In a second step, a second pattern 252 of relatively high resolution may be created on the workpiece 240 by DSA of BCPs over the first pattern 242, to provide, subsequent to transferring (e.g., by etching) the resulting BCP pattern to the underlying substrate 200, the first template 250 including the second pattern 252. As shown in FIG. 2A, the servo regions of the first template 250, which correspond to the servo regions 120 of the template 100, may contain a hexagonal array of circular protrusions formed into radial line-shaped features. Such a hexagonal array of circular protrusions may be formed along the radial line-shaped features of the graphoepitaxial pre-pattern 242 in the servo regions of the workpiece 240 by sphere-forming BCPs (e.g., polystyrene-b/ock-polydimethylsiloxane ["PS-b-PDMS"], polystyrene-b/ock-poly(ferrocenyl dimethylsilane) ["PS-b-PFS"], etc.). As further shown in FIG. 2A, the data regions of the first template 250, which correspond to the data regions 130 of the template 100, may contain radial lamellae. Such radial lamellae may be formed along the radial line-shaped features of the graphoepitaxial pre-pattern 242 in the data regions of the workpiece 240 by cylinder-forming BCPs (e.g., polystyrene-block-polymethylmethacrylate ["PS-b-PMMA"], PS-b-PDMS, PS-b-PFS, etc.) lying down along the radial line-shaped features of the graphoepitaxial pre-pattern 242.

The radial lamellae of the pattern 252 of FIG. 2A may be of a width and pitch to provide the template 100 with protrusions dimensioned as provided herein. Indeed, different sub-templates (e.g., 250a, 250b, 250c, ..., 250n, wherein n indicates the $n^{th}$ sub-template), each including radial lamellae with a different width and pitch, may be used to control the dimensions of the protrusions in the template 100, and, ultimately, the BAR of magnetic features in corresponding patterned recording media. Such control is favorable for simultaneously optimizing different designs for fabrication of read-write heads for recording devices and fabrication of templates.

FIG. 2B provides a schematic illustrating template fabrication for a second sub-template or a second template 270 in accordance with some embodiments. The template fabrication for the second template 270 is a non-limiting example of template fabrication for a template including servo regions and data regions patterned therein.

In a first step, a first pattern 262 of relatively low resolution may be created on a substrate 200 in a to-be-patterned area 202 to provide a workpiece 260 including the first pattern 262. The first pattern 262 may include, but is not limited to, a graphoepitaxial pre-pattern of chevron-shaped features and circumferential line-shaped features for DSA of BCPs. In some embodiments, for example, the first pattern 262 may be a graphoepitaxial pre-pattern formed by electron-beam lithography, interference lithography, photolithography, imprint lithography, or a combination thereof. In a second step, a second pattern 272 of relatively high resolution may be created on the workpiece 260 by DSA of BCPs over the first pattern 262, to provide, subsequent to transferring (e.g., by etching) the resulting BCP pattern to the underlying substrate 200, the second template 270 including the second pattern 272. As shown in FIG. 2B, the servo regions of the second template 270, which correspond to the servo regions 120 of the template 100, may contain a hexagonal array of circular protrusions formed into chevron-shaped features. Such a hexagonal array of circular protrusions may be formed along the chevron-shaped features of the graphoepitaxial pre-pattern 262 in the servo regions of the workpiece 260 by sphere-forming BCPs (e.g., PS-b-PDMS, PS-b-PFS, etc.). As further shown in FIG. 2B, the data regions of the second template 270, which correspond to the data regions 130 of the template 100, may contain circumferential lamellae. Such circumferential lamellae may be formed along the circumferential line-shaped features of the graphoepitaxial pre-pattern 262 in the data regions of the workpiece 260 by cylinder-forming BCPs (e.g., PS-b-PMMA, PS-b-PDMS, PS-b-PFS, etc.) lying down along the circumferential line-shaped features of the graphoepitaxial pre-pattern 262.

The circumferential lamellae of the pattern 272 of FIG. 2B may be of a width and pitch to provide the template 100 with protrusions dimensioned as provided herein. Indeed, different sub-templates (e.g., 270a, 270b, 270c, . . . , 270n, wherein n indicates the $n^{th}$ sub-template), each including circumferential lamellae with a different width and pitch, may be used to control the dimensions of the protrusions in the template 100, and, ultimately, the BAR of magnetic features in corresponding patterned recording media. Such control is favorable for simultaneously optimizing different designs for fabrication of read-write heads for recording devices and fabrication of templates.

FIG. 2C provides a schematic illustrating template fabrication for the template 100 by cross-imprinting the first template 250 of FIG. 2A and the second template 270 of FIG. 2B in accordance with some embodiments. The template fabrication for the template 100 is a non-limiting example of template fabrication for a template including servo regions and data regions patterned therein.

In a first part of a first step, the first template 250 including the second pattern 252 may be created in accordance with FIG. 2A and the description therefor. In a second part of a first step, the second template 270 including the second pattern 272 may be created in accordance with FIG. 2B and the description therefor. In a second step, the second pattern 252 of the first template 250 and the second pattern 272 of the second template 270 may be superimposed by cross-imprinting the first template 250 and the second template 270 on yet another substrate 200 (not shown) in a to-be-patterned area 202 (not shown) to provide, subsequent to transferring (e.g., by etching), the template 100 including a superimposed pattern 102. In an alternative second step, the second pattern 252 of the first template 250 and the second pattern 272 of the second template 270 may be superimposed by cross-imprinting the second template 270 with the first template 250 on the second template 270 to provide, subsequent to transferring (e.g., by etching), the template 100 including the superimposed pattern 102. In an alternative second step, the second pattern 252 of the first template 250 and the second pattern 272 of the second template 270 may be superimposed by cross-imprinting the first template 250 with the second template 270 on the first template 250 to provide, subsequent to transferring (e.g., by etching), the template 100 including the superimposed pattern 102.

While not shown in FIGS. 2A, 2B, and 2C, the template 100 may be subsequently used to fabricate patterned recording media such as BPM by nanoimprint lithography.

FIG. 3A provides a schematic illustrating radial displacement (AR) in template fabrication according to one or more embodiments. In some embodiments, superimposing a first pattern (e.g., the second pattern 252 of the first template 250) and a second pattern (e.g., the second pattern 272 of the second template 270) comprises superimposing with a radial displacement no more than 100 nm, 90 nm, 80 nm, 70 nm, 60 nm, 50 nm, 40 nm, 30 nm, 20 nm, 10 nm, 5 nm, or 1 nm.

FIG. 3B provides a schematic illustrating angular displacement (AA) in template fabrication according to one or more embodiments. In some embodiments, superimposing a first pattern (e.g., the second pattern 252 of the first template 250) and a second pattern (e.g., the second pattern 272 of the second template 270) comprises superimposing with an angular displacement no more than 2500 nrad, 2250 nrad, 2000 nrad, 1750 nrad, 1500 nrad, 1250 nrad, 1000 nrad, 750 nrad, 500 nrad, 250 nrad, 100 nrad, 50 nrad, or 25 nrad.

The larger the radial displacement and/or angular displacement, the more likely a discovery process for registration of tracks across the data regions and the servo regions in corresponding patterned recording media. As such, the radial displacement and/or angular displacement should be minimized in accordance with throughput requirements, optionally in consideration of a discovery process for registration of tracks.

FIG. 4A provides a schematic illustrating template fabrication for the first template 250 of FIG. 2A and the second template 270 of FIG. 2B in accordance with some embodiments. The template fabrication for the first template 250 and the second template 270 is a non-limiting example of template fabrication for a template including servo regions and data regions patterned therein focusing on patterning the data regions.

In a first step, the servo regions of a workpiece 400 (in cross section) corresponding to the workpiece 240 of FIG. 2A or the workpiece 260 of FIG. 2B including a resist-based graphoepitaxial pre-pattern (e.g., the first pattern 242 or the first pattern 262) over a hardmask (e.g., Cr) and a substrate (e.g., glass, quartz, Si, etc.) may be protected with a protective layer to provide a workpiece 410. The data regions of the workpiece 410 may be left unprotected for patterning to increase feature density in the data regions. In a second step, the resist in the data regions of the workpiece 410 may be thinned (e.g., by etching) to form a workpiece 420 including a relatively low topography pre-pattern in the data regions compared to a relatively high topography pre-pattern in the servo regions. (See FIG. 5A for a workpiece 520 and an image corresponding to the low topography pre-pattern in the data regions of the workpiece 420.) In a third step, a cylinder-forming BCP (e.g., PS-b-PMMA, PS-b-PDMS, PS-b-PFS, etc.) may be deposited (e.g., by spin coating) over the low topography pre-pattern in the data regions of the workpiece 420. The BCP may be subsequently annealed (e.g., thermal annealing, solvent annealing, thermosolvent annealing, etc.) to separate the BCP into a microphase-based pattern as illustrated by polymeric cylinders (lying down) atop the low topography pre-pattern in the data regions of a workpiece 430. (See FIG. 5A for a workpiece 530 and an image corresponding to the polymeric cylinders of PS-b-PDMS atop the low topography pre-pattern in the data regions of the workpiece 430.) In a fourth step, the pattern may be transferred (e.g., by etching) to the hardmask of the workpiece 430 to provide a workpiece 440 including a patterned hardmask in the data regions.

FIG. 4B provides a schematic illustrating template fabrication for the first template 250 of FIG. 2A and the second template 270 of FIG. 2B in accordance with some embodiments. The template fabrication for the first template 250 and the second template 270 is a non-limiting example of template fabrication for a template including servo regions and data regions patterned therein focusing on patterning the servo regions.

In a first step, the servo regions of the workpiece 440 may be de-protected. The data regions may be subsequently protected with a protective layer to provide a workpiece 450 in which the servo regions may be left unprotected for patterning to increase feature density in the servo regions. In a second step, a sphere-forming BCP (e.g., PS-b-PDMS, PS-b-PFS, etc.) may be deposited (e.g., by spin coating) over the high topography pre-pattern in the servo regions of the workpiece 450. The BCP may be subsequently annealed (e.g., thermal annealing, solvent annealing, thermosolvent annealing, etc.) to separate the BCP into a microphase-based pattern as illustrated by polymeric spheres within or confined by the high topography pre-pattern in the servo regions of a workpiece 460. (See FIG. 5B for DSA of sphere-forming BCPs on a workpiece 550 to provide a workpiece 560 and images corresponding to polymeric spheres of PS-b-PDMS within the high topography pre-pattern in the servo regions of the workpiece 460.) In a third step, the pattern may be transferred (e.g., by etching) to the hardmask of the workpiece 460 to provide a workpiece 470 including a patterned hardmask in the servo regions. In a fourth step, the data regions of the workpiece 470 may be de-protected to provide a workpiece 480 in which the hardmask is patterned in accordance with the microphase-based pattern of the sphere-forming BCP in the servo regions and the microphase-based pattern of the cylinder-forming BCP of FIG. 4A in the data regions. In a fifth step, the pattern of the patterned hardmask may be transferred (e.g., by etching) to the substrate to provide a template 490 (e.g., the first template 250 of FIG. 2A or the second template 270 of FIG. 2B).

It should be understood that while the template fabrication for the first template 250 of FIG. 2A and the second template 270 may proceed in accordance with FIGS. 4A and 4B, the template fabrication for the first template 250 and the second template 270 is not limited to that illustrated in FIGS. 4A and 4B as one or more steps may be modified and/or practiced in a different order as provided by the following two examples.

In a first example, FIGS. 4A and 4B illustrate the pattern of the patterned hardmask across a combination of the servo regions and the data regions may be transferred to the substrate of the workpiece 480 all at once in the last step of the template fabrication to provide the template 490. Alternatively, the pattern of the patterned hardmask across the servo regions and, separately, the data regions may be individually transferred to the substrate. For example, following on the fourth step provided in reference to FIG. 4A of transferring the microphase-based pattern of the cylinder-forming BCP to the hardmask, the pattern may be subsequently transferred (e.g., by etching) to the substrate of the workpiece 440. Likewise, following on the third step provided in reference to FIG. 4B of transferring the microphase-based pattern of the sphere-forming BCP to the hardmask, the pattern may be subsequently be transferred (e.g., by etching) to the substrate of the workpiece 470. Subsequent deprotection of the already substrate-etched data regions in accordance with the fourth step provided in reference to FIG. 4B may provide the template 490 obviating the fifth step provided in reference to FIG. 4B. While piecemeal etching of the substrate in accordance with the foregoing adds an additional step, piecemeal etching of the substrate may circumvent etching defects that may occur from the difference in protrusion density between the servo regions and the data regions.

In a second example, FIGS. 4A and 4B illustrate protection of the servo regions first for patterning to increase feature density in the data regions followed by protection of the data regions second for patterning to increase feature density in the servo regions. Alternatively, the data regions may be protected first for patterning to increase feature density in the servo regions, and the servo regions may be protected second for patterning to increase feature density in the data regions. A height differential or step height ($\Delta h$) exists between a top of a protective layer and an adjacent, unprotected resist-based graphoepitaxial pre-pattern. Such a step height ($\Delta h$) is illustrated in FIG. 4A between the protective layer over the servo regions and the low topography pre-pattern in the data regions. By protecting the data regions first and patterning the servo regions, the step height ($\Delta h$) between the subsequent protective layer over the patterned servo regions and the low topography pre-pattern in the data regions may be reduced on account of, for example, material removed from the servo regions. A reduced step height ($\Delta h$) may result in improved uniformity for thin films of BCPs applied by spin coating and reduce bi-layer defects in DSA.

FIG. 6 provides a schematic illustrating servo region protection in template fabrication in accordance with some embodiments. Protection of the servo regions in template fabrication is a non-limiting example of regional protection in template fabrication focusing on the servo regions.

In a first step, a second hardmask (e.g., Cr, Ta, Ti, etc.) may be deposited (e.g., by sputter deposition) over the servo regions and the data regions of a workpiece 400 (in cross section) corresponding to the workpiece 240 of FIG. 2A or the workpiece 260 of FIG. 2B including a first resist-based graphoepitaxial pre-pattern (e.g., the first pattern 242 or the first pattern 262) over a first hardmask and a substrate to provide a workpiece 604. The second hardmask may be chosen on a basis of etch selectivity over the first hardmask. In a second step, a second resist (e.g., positive photoresist) may be deposited (e.g., by spin coating) over the servo regions and the data regions of the workpiece 604 to provide a workpiece 606. In a third step, the second resist may be irradiated (e.g., UV, deep UV, etc.) over the data regions using a mask, thereby making the second resist over the data regions soluble in a developer. The second resist may be subsequently removed from the data regions by dissolution in the developer. In a fourth step, the second hardmask may be removed (e.g., by etching) from the data regions to provide the workpiece 410 including a protective layer over the servo regions, wherein the protective layer is the second resist over the second hardmask.

It should be understood that while regional protection in template fabrication may proceed in accordance with FIG. 6, regional protection in template fabrication is not limited to that illustrated in FIG. 6 as one or more steps may be modified for protection of the servo regions or the data regions in template fabrication as provided by the following three examples.

In a first example, the second and third steps provided in reference to FIG. 6 may be modified for protection of the servo regions in template fabrication. Instead of the example positive resist, the second resist deposited in the second step may be a negative photoresist. The second resist may be subsequently irradiated in accordance with the third step but over the servo regions using a different mask, thereby making the second resist over the servo regions insoluble in the developer for ultimately protecting the servo regions.

In a second example, the third step provided in reference to FIG. 6 may be modified for protection of the data regions in template fabrication. Instead of irradiating the example positive resist over the data regions in the third step, the second resist may be irradiated over the servo regions using a different mask, thereby making the second resist over the servo regions soluble in the developer for ultimately protecting the data regions.

In third example, the second and third steps provided in reference to FIG. 6 may be modified for protection of the data regions in template fabrication. Instead of the example positive resist, the second resist deposited in the second step may be a negative photoresist. The second resist may be subsequently irradiated in accordance with the third step over the data regions using the mask, thereby making the second resist over the data regions insoluble in the developer for ultimately protecting the data regions.

As such, provided herein is an apparatus, comprising a rectangular array of rectangular protrusions in a first region corresponding to a data region; and a hexagonal array of circular protrusions in a second region corresponding to a servo region, wherein a first global protrusion density for the first region is greater than a second global protrusion density for the second region. In some embodiments, the rectangular array of rectangular protrusions comprises an arbitrary skew angle of more than about 8°. In some embodiments, the rectangular protrusions comprise an arbitrary bit aspect ratio of at least about 1 such as at least about 4. In some embodiments, the rectangular protrusions comprise an arbitrary bit aspect ratio of no more than about 5 such as no more than about 4. In some embodiments, the hexagonal array of circular protrusions is formed into one or more chevron-shaped features corresponding to burst patterns in the servo region. In some embodiments, the hexagonal array of circular protrusions is formed into one or more line-shaped features corresponding to preamble patterns in the servo region. In some embodiments, the apparatus is an imprint template for bit-patterned recording media, wherein the first and second regions respectively correspond to data and servo regions of the bit-patterned recording media.

Also provided herein is a method, comprising forming a first template; forming a second template; and cross-imprinting the first template and the second template to form a third template comprising a rectangular array of rectangular protrusions in a first region of the third template corresponding to a data region and a hexagonal array of circular protrusions in a second region of the third template corresponding to a servo region, wherein a first global protrusion density for the first region is greater than a second global protrusion density for the second region. In some embodiments, forming the first template comprises forming circumferential lamellae by directed self-assembly of cylinder-forming block copolymers atop a graphoepitaxial pre-pattern in a first region of the first template corresponding to the first region of the third template. In some embodiments, forming the first template further comprises forming chevron-shaped features by directed self-assembly of sphere-forming block copolymers within a graphoepitaxial pre-pattern in a first portion of a second region of the first template corresponding to the second region of the third template. In some embodiments, forming the first template further comprises transferring the circumferential lamellae and the chevron-shaped features into an underlying hardmask or substrate. In some embodiments, forming the first template further comprises protecting one region of the first region and the second region before steps of directing self-assembly and transferring the other one region of the first region and the second region. In some embodiments, forming the second template comprises forming radial lamellae by directed self-assembly of cylinder-forming block copolymers atop a graphoepitaxial pre-pattern in a first region of the second template corresponding to the first region of the third template. In some embodiments, forming the second template comprises forming line-shaped features by directed self-assembly of sphere-forming block copolymers within a graphoepitaxial pre-pattern in a second portion of a second region of the second template corresponding to the second region of the third template. In some embodiments, forming the second template further comprises transferring the radial lamellae and the line-shaped features into an underlying hardmask or substrate. In some embodiments, forming the first template further comprises protecting one region of the first region and the second region before steps of directing self-assembly and transferring the other one region of the first region and the second region.

Also provided herein is a method, comprising cross-imprinting a first template and a second template to form a third template comprising a rectangular array of rectangular protrusions in a first region of the third template corresponding to a data region and a hexagonal array of circular protrusions in a second region of the third template corresponding to a servo region, wherein a first global protrusion density for the first region is greater than a second global protrusion density for the second region. In some embodiments, the rectangular protrusions comprise an arbitrary bit aspect ratio of about 1-5 such as about 1-4 or such as about 4-5. In some embodiments, the hexagonal array of circular protrusions is formed into one or more chevron-shaped features corresponding to burst patterns in the servo region, and the hexagonal array of circular protrusions is formed into one or more line-shaped features corresponding to preamble patterns in the servo region. In some embodiments, the method further comprises performing imprint lithography with the third template for subsequently producing a bit-patterned recording medium, wherein the first and second regions respectively correspond to data and servo regions of the bit-patterned recording medium.

While some particular embodiments have been provided herein, and while the particular embodiments have been provided in some detail, it is not the intention of the applicant(s) for the particular embodiments to limit the scope of the concepts provided herein. Additional adaptations and/or modifications may readily appear to those of ordinary skill in the art, and, in broader aspects, these adaptations and/or modifications may be encompassed as well. Accordingly, departures may be made from the particular embodiments provided herein without departing from the scope of the concepts provided herein.

What is claimed is:
1. An apparatus, comprising
a rectangular array of rectangular protrusions in a first region corresponding to a data region; and
a hexagonal array of circular protrusions in a second region corresponding to a servo region,
wherein a first global protrusion density for the first region is greater than a second global protrusion density for the second region.
2. The apparatus of claim 1,
wherein the rectangular array of rectangular protrusions comprises an arbitrary skew angle of more than about 8°.
3. The apparatus of claim 1,
wherein the rectangular protrusions comprise an arbitrary bit aspect ratio of at least about 1.
4. The apparatus of claim 1,
wherein the rectangular protrusions comprise an arbitrary bit aspect ratio of no more than about 4.
5. The apparatus of claim 1,
wherein the hexagonal array of circular protrusions is formed into one or more chevron-shaped features corresponding to burst patterns in the servo region.
6. The apparatus of claim 1,
wherein the hexagonal array of circular protrusions is formed into one or more line-shaped features corresponding to preamble patterns in the servo region.
7. The apparatus of claim 1,
wherein the apparatus is an imprint template for bit-patterned recording media, and
wherein the first and second regions respectively correspond to data and servo regions of the bit-patterned recording media.

8. A method, comprising
forming a first template;
forming a second template; and
cross-imprinting the first template and the second template to form a third template comprising
   a rectangular array of rectangular protrusions in a first region of the third template corresponding to a data region and
   a hexagonal array of circular protrusions in a second region of the third template corresponding to a servo region,
      wherein a first global protrusion density for the first region is greater than a second global protrusion density for the second region.

9. The method of claim 8,
wherein forming the first template comprises forming circumferential lamellae by directed self-assembly of cylinder-forming block copolymers atop a graphoepitaxial pre-pattern in a first region of the first template corresponding to the first region of the third template.

10. The method of claim 9,
wherein forming the first template further comprises forming chevron-shaped features by directed self-assembly of sphere-forming block copolymers within a graphoepitaxial pre-pattern in a first portion of a second region of the first template corresponding to the second region of the third template.

11. The method of claim 10,
wherein forming the first template further comprises transferring the circumferential lamellae and the chevron-shaped features into an underlying hardmask or substrate.

12. The method of claim 11,
wherein forming the first template further comprises protecting one region of the first region and the second region before steps of directing self-assembly and transferring the other one region of the first region and the second region.

13. The method of claim 8,
wherein forming the second template comprises forming radial lamellae by directed self-assembly of cylinder-forming block copolymers atop a graphoepitaxial pre-pattern in a first region of the second template corresponding to the first region of the third template.

14. The method of claim 13,
wherein forming the second template comprises forming line-shaped features by directed self-assembly of sphere-forming block copolymers within a graphoepitaxial pre-pattern in a second portion of a second region of the second template corresponding to the second region of the third template.

15. The method of claim 14,
wherein forming the second template further comprises transferring the radial lamellae and the line-shaped features into an underlying hardmask or substrate.

16. The method of claim 15,
wherein forming the first template further comprises protecting one region of the first region and the second region before steps of directing self-assembly and transferring the other one region of the first region and the second region.

17. A method, comprising
cross-imprinting a first template and a second template to form a third template comprising
   a rectangular array of rectangular protrusions in a first region of the third template corresponding to a data region and
   a hexagonal array of circular protrusions in a second region of the third template corresponding to a servo region,
      wherein a first global protrusion density for the first region is greater than a second global protrusion density for the second region.

18. The method of claim 17,
wherein the rectangular protrusions comprise an arbitrary bit aspect ratio of about 1-4.

19. The method of claim 17,
wherein the hexagonal array of circular protrusions is formed into one or more chevron-shaped features corresponding to burst patterns in the servo region, and
wherein the hexagonal array of circular protrusions is formed into one or more line-shaped features corresponding to preamble patterns in the servo region.

20. The method of claim 17, further comprising
performing imprint lithography with the third template for subsequently producing a bit-patterned recording medium,
   wherein the first and second regions respectively correspond to data and servo regions of the bit-patterned recording medium.

* * * * *